United States Patent [19]

Baker et al.

[11] Patent Number: 4,652,973
[45] Date of Patent: Mar. 24, 1987

[54] CHIP CARRIER MOUNTING APPARATUS

[75] Inventors: Paul A. Baker; Michael G. Strautz, both of Columbus, Ohio

[73] Assignee: AT&T Bell Laboratories, Murray Hill, N.J.

[21] Appl. No.: 772,345

[22] Filed: Sep. 4, 1985

[51] Int. Cl.$^4$ .............................................. H05K 7/20
[52] U.S. Cl. .................................. 361/395; 361/386; 339/61 M; 339/DIG. 3
[58] Field of Search ............................... 361/393-396, 361/398, 400, 401, 412-414, 386, 387, 388; 174/52 FP; 339/17 C, 17 CF, 17 F, 17 M, 17 LM, 61 M, 17 MP, DIG. 3

[56] References Cited

U.S. PATENT DOCUMENTS

| | | | |
|---|---|---|---|
| 3,866,307 | 2/1975 | Pfahl, Jr. et al. | 29/498 |
| 3,904,102 | 9/1975 | Chu et al. | 228/180 |
| 3,917,984 | 11/1975 | Kong et al. | 317/101 |
| 4,065,197 | 12/1977 | Kuist et al. | 339/17 |
| 4,118,102 | 10/1978 | Kuist et al. | 339/17 |
| 4,144,648 | 3/1979 | Grovender | 339/75 |

FOREIGN PATENT DOCUMENTS 152033 9/1963 Japan .
159578 9/1979 Japan .

OTHER PUBLICATIONS

"Anisotropic Conduction in Elastomeric Composites", ECSG Connector Symposium Proc., Oct. 23–4, 1974, C. H. Kuist, pp 204–210.
New Product Disclosure by SP America, Elastomeric Connector Offers High-Density Connections Without Soldering, Electronic Pkg. & Production, Aug. 1985, p. 121.

Primary Examiner—G. P. Tolin
Attorney, Agent, or Firm—Dwight A. Marshall

[57] ABSTRACT

An apparatus for mounting ceramic chip carrier devices onto printed circuit boards. The apparatus includes an adapter assembly with contact terminals, which is positioned and secured by a plastic frame to the circuit board, a washer member containing magnetically aligned electrically conductive particles, and a cover or clip to maintain each contact terminal in engagement with the corresponding conductive particles to electrically couple the adapter assembly and printed circuit board with a chip carrier device. This design incorporates features of both metal and elastomeric contact systems. Alternative apparatus for mounting integrated circuit chips onto printed circuit boards is also disclosed. Such apparatus includes an insulating frame, an elastomeric washer member containing electrically conductive particles, and a cover for holding assemblage together. These designs may require a small number of holes in the circuit board or may provide for surface mounting instead.

3 Claims, 6 Drawing Figures

CHIP CARRIER MOUNTING APPARATUS

TECHNICAL FIELD

This invention relates to apparatus for mounting circuit components onto the surface of printed wiring circuit boards. In particular, it relates to an assembly for use in mounting a ceramic chip carrier device on a printed wiring circuit board and electrically interconnecting the device with circuitry of the circuit board.

DESCRIPTION OF THE PRIOR ART

Integrated semiconductor circuit devices, or chips, contain a variety of miniaturized electrical circuitry. Chips are widely used in the electronics and communications industries as components on printed wiring circuit boards. Such components are then often combined to form larger electrical circuits. Typically, a chip is a relatively small, fragile device which is mounted on a ceramic substrate called a chip carrier. Electrical conducting leads generally extend outwardly from the circuitry of the chip and are coupled to a plurality of metallic conducting pads, or terminals, positioned on the chip carrier immediately adjacent each edge thereof. The chip or the combination of the chip and the chip carrier is hermetically sealed to form an integrated circuit chip carrier module (sometimes simply referred to as the integrated circuit) wherein electrical connections extend from the terminals adjacent the edges of the module to the electrical circuitry of the chip. A very common arrangement in the art has terminals extending on two opposite edges of the module forming what is known as a dual in-line package.

Typically, integrated circuits are mounted on printed wiring circuit boards either by soldering the legs of the dual in-line package directly to the circuit board or by plugging the dual in-line package into a socket which has been soldered into place on the circuit board. For example, U.S. Pat. No. 3,917,984, issued Nov. 4, 1975 to G. C. Kong et al., describes a printed circuit board having a plurality of sockets mounted thereon. Integrated circuits can be inserted into and removed from the sockets, thus making electrical connections to the circuit board as desired. Generally, such sockets comprise a one piece insulating base member having pockets or cavities located around the perimeter to hold electrical conductive members. Each electrical conducting member has a tail portion which is inserted into a base member's cavity or pocket so as to engage the tail portion with the base member, thus holding the electrical conducting member in place. The tail portion extends beneath the base member into a hole drilled through the printed wiring circuit board. The tail portion may then be soldered to the circuitry printed on the circuit board. Although soldering provides a good electrical connection, assembly and removal of the sockets are difficult due to the necessity of applying heat. Overheating can cause damage to the integrated circuit and can cause cracks in its glass seal.

One problem in using this type of connector apparatus (i.e., the integrated circuit connected directly to the printed circuit board or via a socket) occurs when multilayer circuit boards are used, because a hole in the circuit board is required for each and every lead or leg. Holes drilled in such circuit boards may interfere with or damage various layers of circuitry. Over and above that, manufacturing printed circuit boards with holes is much more expensive than manufacturing such boards without holes; particularly when those holes must be plated through.

To overcome the problem associated with printed circuit boards with holes adapted to accept the leads of integrated circuits or their sockets, alternative types of connector apparatus have been developed. For example, in U.S. Pat. No. 4,144,648, issued Mar. 20, 1979, S. L. Grovender describes a connector having a metallic base with four posts which is attached in a slightly elevated fashion to a printed circuit board through the four posts (soldered). A conductive elastomeric sheet is placed underneath the elevated metallic base, a plastic positioning frame is positioned in the base, a chip carrier is placed in the positioning frame, and a cover holds the whole assemblage together.

The problem with Grovender's connector is that the elastomeric sheet is held in place either by friction alone or with the aid of an applied adhesive, that the metallic base must be soldered into holes (which are shown to be of the plated-through variety), and that it requires a complex positioning frame.

It is an object of this invention to provide mounting apparatus for connecting integrated circuit chips to printed wiring circuit boards. It is a further object of this invention to provide a mounting apparatus that is inexpensively manufactured and easily assembled to interconnect with integrated circuit chip carriers. It is a still further object of this invention to provide a mounting apparatus that is easily and inexpensively attachable to printed wiring circuit boards and yields an operationally reliable connection.

SUMMARY OF THE INVENTION

The foregoing objects are achieved by the present invention, which comprises a socket member that may be engaged with contact pads located on a printed circuit board, a washer member, and means for forcibly engaging the socket and washer members with the chip carrier, thereby creating and ensuring appropriate electrical contacts between the chip carrier and the circuitry of the printed wiring circuit board.

The washer member is formed of electrically insulating material and contains conductive paths which make electrical contact between the contact members of the socket and the terminals of the chip carrier.

A cover engages the socket member adapter assembly and maintains each terminal of a chip carrier in engagement with the washer member, thereby establishing an electrical connection through the electrical conducting particles to the printed circuit board.

BRIEF DESCRIPTION OF THE DRAWING

In the accompanying drawings which illustrate the invention.

DETAILED DESCRIPTION

Figure 1:
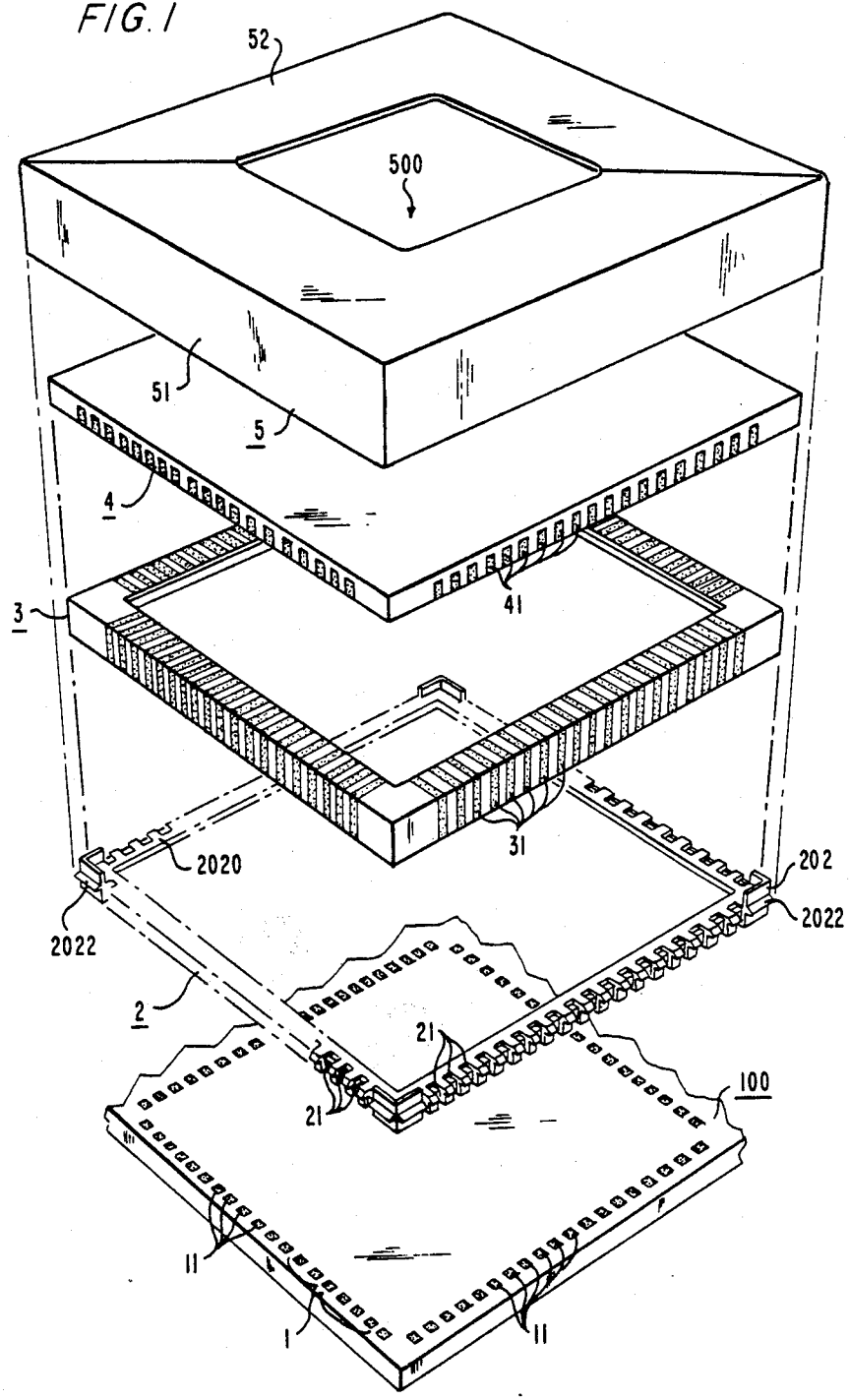
FIG. 1 is an isometric exploded view of the chip carrier mounting apparatus showing a printed wiring circuit board, a device footprint on the printed circuit board, a socket member adapter assembly, a washer member, chip carrier, and cover.

As shown in the drawings and more specifically in FIG. 1, adapter assembly socket member 2 is intended for use in mounting module 4 on a printed circuit wiring board 100. Module 4 generally comprises a small integrated circuit chip mounted on a ceramic chip carrier and arranged such that the electrical circuitry of the chip is coupled by connecting leads to a plurality of metallic terminals 41 positioned about the perimeter of the chip carrier. Typically, the chip, or the combination of the chip, chip carrier and connecting leads, is hermetically sealed to form module 4. Socket member 2 is designed to hold module 4 and interconnect terminals 41 to device footprint 1 on printed wiring circuit board 100, via a washer member 3 and electrical conducting members 21. Device footprint 1 is embedded in printed wiring circuit board 100 and is part of the printed circuit wiring. Thus, each circuit board land 11 (part of footprint 1) interconnects with the conducting paths of the circuit board. Device footprint 1 conforms to the shape of adapter assembly socket member 2. More specifically, each land 11 is situated to make contact with a corresponding electrical conducting member 21 of the adapter assembly socket member 2, thus permitting socket member 2 to be attached to the surface of the circuit board. Cover member 5 is positioned over socket member 2 and engaged with tab 2022 to clamp socket member 2 and washer member 3 to module 4 and maintain each terminal 41 in electrical engagement with conducting member 21, via a corresponding conductive path 31.

Figure 2:
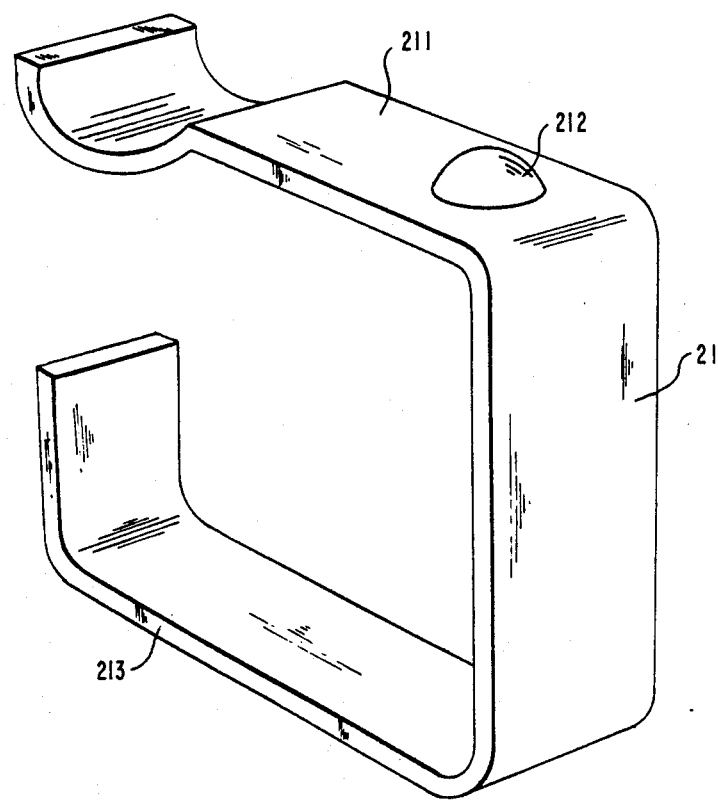
FIG. 2 is an enlarged view of an electrical conducting member of the socket member adapter assembly set forth in FIG. 1.

Electrical conducting members 21, set forth in FIG. 2, are constructed of an electrical conducting resilient spring material. For the illustrated embodiment of socket member 2 each conducting member 21 is formed in a generally C-shaped configuration. The top surface 211 of the conducting members 21 contains a raised dimple 212. Dimple 212 defines a relatively small contact area and provides a surface for the concentration of forces in assembly of the apparatus. This raised dimple point of contact has advantages over a flat surface in its ability to break through surface films and ensure proper electrical contact.

Top and bottom surfaces 211 and 213 respectively, of electrical conducting members 21 may be any well known type of contact material such as a precious metal sputtered or electroplated onto the resilient spring material. In assembly, the bottom surfaces 213 of the conducting members 21 are soldered to circuit board lands 11 to secure socket member 2 to the circuit board. The soldering may conventionally be performed via a vapor phase reflow soldering technique such as disclosed in U.S. Pat. No. 3,904,102 issued Sept. 9, 1975 to Chu et al. and in U.S. Pat. No. 3,866,307 issued Feb. 18, 1975 to Pfahl et al.

Figure 3:
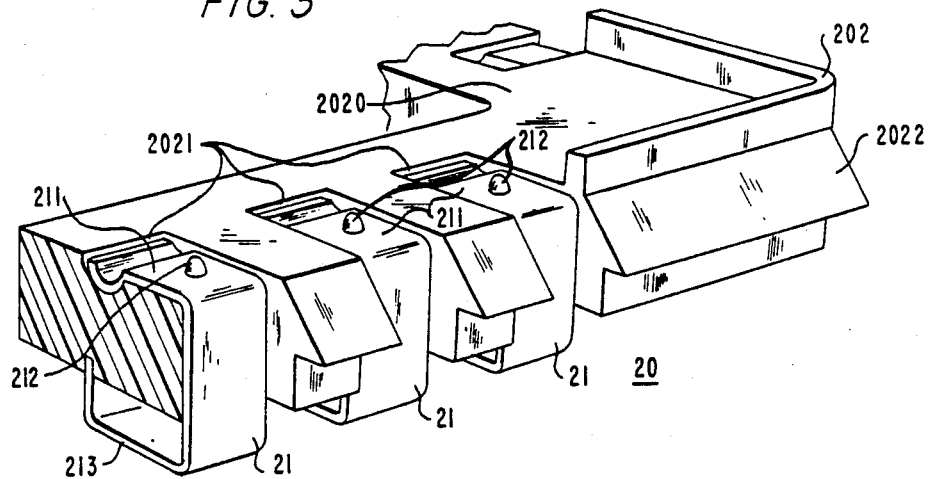
FIG. 3 is an enlarged sectional view of the socket member adapter assembly set forth in FIG. 1.

As set forth in FIG. 3 of the drawing, socket member 2 includes a first insulating member 20 formed to receive washer member 3 and module 4, and electrical conducting members 21 such that a top contact 211 including dimple 212 of each conducting member 21 is aligned with a corresponding conductive path 31 of washer member 3 and a corresponding terminal 41 of module 4. Insulating member 20 of FIG. 3 is a generally rectangular structure constructed of an electrically insulating material with raised cornerpost sections 202 extending a short distance away from the corner along each of the two edges to guide and align the positioning of washer member 3 and module 4 onto socket member 2 on the inside of the cornerpost sections 202.

Each of the four outer side surfaces of insulating member 20 has a row of parallel slots 2021 intended to receive electrical conducting members 21. Also along the outer edge of each of the four sides is tab 2022 which engages with cover member 5 thereby maintaining the engagement of socket member 2, washer member 3, and module 4. Tab 2022 is a V-shaped tab arranged to cooperate with a similar V-shaped tab 55 in cover member 5 (described infra) to engage with each other in a snap action.

As set forth in FIG. 1, washer member 3 is shaped in conformity with socket member 2 so that washer member 3 fits on the top surface (2020) of socket member 2 between corner sections 202. Washer member 3 is formed of an elastomeric material which contains electrically conductive particles. U.S. Pat. No. 4,065,197, issued Dec. 27, 1977 to C. H. Kuist et al., U.S. Pat. No. 4,118,102, issued Oct. 3, 1978 to C. H. Kuist et al., and the paper by C. H. Kuist, *Anisotropic Conduction in Elastomeric Composites,* E.C.S.G. Connector Symposium, Oct. 1974, pp. 204–210 disclose an electrical sheet connector which is made from a mixture of flexible insulator material and metal particles. The metal particles are randomly placed within the nonconductive matrix material, thus electrical conduction depends on the distance between any two points. The conductive paths of the washer member of our invention can be formed by the alignment of metal particles dispersed in an insulating material. Such an arrangement is disclosed in U.S. patent application Ser. No. 728,813, filed Apr. 30, 1985 by Jin et al., wherein electrical interconnections are made through chains of magnetically aligned, electrical conducting particles, and such interconnections are further enhanced by the protusion of end particles of these chains from a free surface on at least one side of the elastomeric material. In the present invention, these conductive particles form essentially straight chains, viz. conducting paths 31, within the polymer resulting from application of a magnetic field in the Z direction of desired conductivity transverse to the x-y plane of the elastomeric material. Conducting paths 31 containing chains of conductive particles are magnetically aligned and thereby spaced apart to conform to the spacing of each slot 2021 of socket member 2. When washer member 3 is positioned on surface 2020 of socket member 2, conducting paths 31 are aligned with slots 2021 and contact surfaces 211 of conducting members 21, thereby establishing a corresponding electrical connection through, each conductive chain 31.

Figure 4:
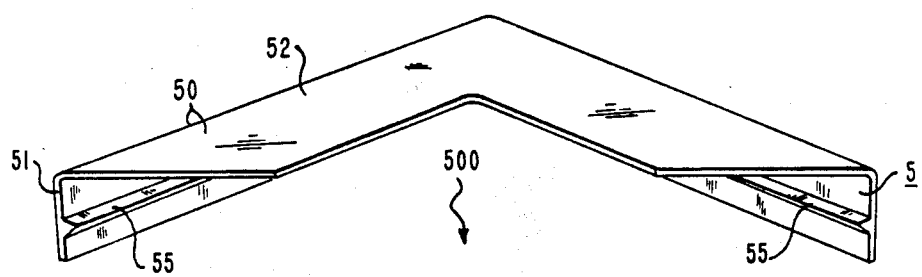
FIG. 4 is an enlarged sectional view of a part of the cover set forth in FIG. 1.

As shown in FIG. 4 of the drawing, cover member 5 is a generally rectangular structure conforming to the structure of socket member 2, constructed of a spring type material, such as metal or certain plastics, which provides spring compliance. A metallic spring type material offers the further advantage of conducting heat away from chip carrier module 4. In FIG. 4, cover member 5 has quadrilateral members 50 with sides 51 and top 52 joined at right angles to each other to form a chamber 500 for receiving a heat sink such as an aluminum disk, thereby enhancing the thermal conduction properties of cover member 5. On the inside of each quadrilateral member 50 is a tab 55 that has a V shape arranged to slide over V-shaped tab 2022 and snap into place.

Figure 5:
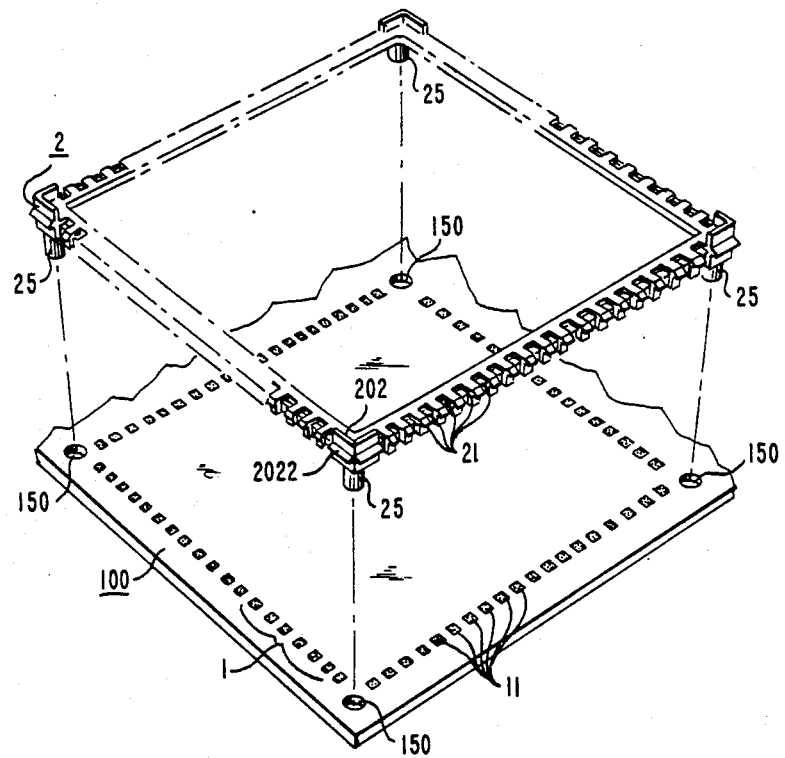
FIG. 5 is an enlarged view of a modified socket member adapter assembly and corresponding printed wiring circuit board.

The described embodiment provides a device which is easily assembled, easily manufactured, and provides a straightforward, inexpensive method of interconnecting the circuitry of printed wiring circuit boards with integrated circuit chip carriers. To further ease the connection of the carrier chip mounting apparatus to the printed circuit boards, the soldering process can be eliminated. This improvement is realized with a modified socket member adapter assembly 2 as shown in FIG. 5. In this embodiment, molded posts 25 of insulating material (e.g., plastic) have been added to the bottom surface of socket member 2 at each corner. Post 25 may either be an extension of the material of socket member 2 or adhered to socket member 2. Posts 25 pass through holes 150 in printed wiring circuit board 100 and protrude underneath the circuit board. During assembly, each such protusion is heat staked to form a rivet type head which will maintain the engagement of socket member adapter assembly 2 with printed circuit board 100. The spacing of holes 150 and the positioning and engagement of socket member 2 provide for the alignment of circuit board lands 11 with electrical conducting members 21, thereby ensuring that proper electrical contact between the circuitry of the board and the chip carrier will ultimately be achieved.

Although the above-described embodiment of this invention does require holes in the printed circuit board, it does offer an advantage similar to that realized by its surface mount counterpart; viz. that no soldering of the chip carrier is required. The shape of socket member 2 and device footprint 1 determine the number of holes required in the circuit board, but in most applications no more than four holes would be required. The manufacturing process is greatly simplified (yielding a corresponding cost reduction) by the fact that holes 150 need not be plated through.

Figure 6:
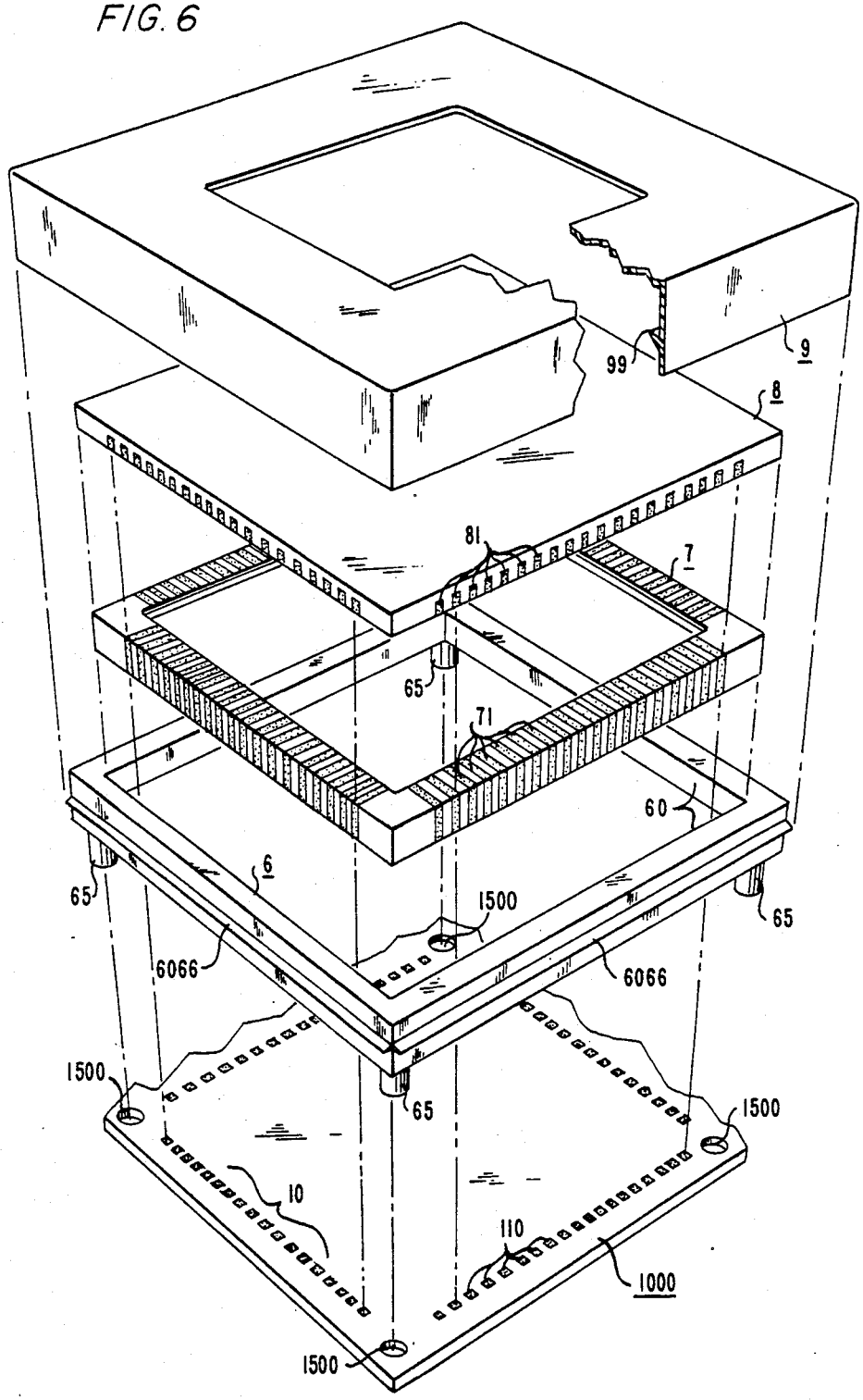
FIG. 6 is an isometric exploded view of a variation of the chip carrier mounting apparatus showing a printed wiring circuit board containing holes and a device footprint, a frame, a washer member, a chip carrier, and a cover.

Another embodiment of our invention, where adapter assembly socket member 2 with conducting members 21 is replaced with frame 6, is shown in FIG. 6. As shown in FIG. 6, mounting apparatus now comprises base frame 6, washer member 7, and cover member 9. In the illustrated embodiment, base frame 6 is molded or stamped from an electrically insulating material such as plastic. Washer member 7 is an elastomeric material such as described above which contains electrically conductive particles.

The bottom surface of quadrilateral members 60 of frame 6 rests on the surface of printed circuit board 1000, framing the outer edges of device footprint 10 but remaining out of contact with circuit board lands 110. Frame 6 is then suitably secured to the printed circuit board. For example, posts 65 pass through holes 1500 in printed wiring circuit board 1000 and protrude underneath the circuit board. Each protusion is heat staked to form a rivet type head, thereby securing frame 6 to circuit board 1000. When a surface mount is preferred, an alternative embodiment is used wherein metal strips are embedded into members 60 such that the ends of the metal strips protrude from the bottom surface of members 60. Conventional techniques are then used to solder frame 6 to the surface of the circuit board at each of these points. The number of contact points between frame 6 and the circuit board (i.e., either post/hole combinations or metal strip/solder points) is dictated by the need to keep washer member 7 completely stationary.

Washer member 7 is placed within the structure of frame 6 and rests directly upon lands 110 on printed circuit board 1000. Washer member 7 contains magnetically aligned electrically conductive particles, viz., conducting paths 71. These paths 71 must be aligned with corresponding lands 110 so that proper electrical contact between chip carrier 8 and the circuitry of the printed wiring circuit board is maintained.

Chip carrier module 8 is inserted into frame 6 and rests directly upon washer member 7. Again, the conductive paths 71 of washer member 7 must be aligned with contact members 81 of chip carrier module 8.

Cover member 9 is next snapped onto the assembled composite via V-shaped tabs 99 within cover member 9 interlocking with V-shaped tabs 6066 of fastener 6. During assembly, washer member 7 is compressed against chip carrier module 8 thereby providing pressure on washer 7 and module 8 to establish electrical interconnection between the circuitry of the printed wiring circuit board (via circuit board lands 110) and contact members 81 of chip carrier module 8 through washer member 7.

In an alternative embodiment wherein the elastomeric washer contains randomly spaced conductive particles, pressure and the distance between contact points are crucial factors in ensuring proper electrical interconnections, while the alignment of conductive parts of apparatus components is no longer a necessity.

Removal of a chip carrier from this mounting apparatus is accomplished by prying open the cover so that the tabs of the cover and fastener disengage. The chip carrier is then lifted out of the frame, a replacement carrier can be inserted if desired, and the cover is snapped back into place.

The above-described embodiments of the invention offer several advantages in effecting electrical interconnections between circuitry of printed wiring circuit boards and chip carriers. It should be realized that it is entirely possible to reconfigure mounting apparatus illustrated herein without departing from the scope and spirit of our invention.

What is claimed is:

1. An apparatus mounting an integrated circuit chip carrier (4) having terminals (41) onto a surface of a circuit board (1), said apparatus comprising:
   an electrical conductive washer member (3);
   a generally rectangular frame (2) receiving said washer member and the chip carrier and having a V-shaped tab (2022) formed around the outer edge thereof with parallel slits (2021) formed therein receiving a plurality of generally C-configured electrical contacts (21) each of said electrical contacts being formed of an electrical conducting resilient spring material each positioned in one of said slots to have a bottom spring contact surface (213) engaging the circuit board and having a top surface (211) containing a raised dimple (212), said dimple defining a contact area extending above said frame which engaged said washer member to establish an electrical path between said washer member and the circuit board; and
   means (5) engaging said frame with said washer member and the chip carrier positioned therebetween, said engaging means having side walls (51) conforming in size to said frame with a generally V-shaped tab (55) located around an inside perimeter of said walls formed to slide over and engage said frame V-shaped tab for compressing the chip carrier and said washer member in engagement with said frame such that said compressed washer member provides electrical continuity from said dimples of said frame contacts through said washer member to respective chip carrier terminals.

2. The mounting apparatus of claim 1 characterized in that said washer member comprises an elastomeric material for insuring electrical interconnections between said chip carrier and frame electrical contacts and which contains electrically conductive particles formed into chain patterns such that good electrical conduction in a first direction is provided between each chip carrier terminal and a corresponding dimple contact area, while conduction in directions orthogonal to said first direction is inhibited.

3. The mounting apparatus of claim 1 characterized in that said means engaging comprises a cover member (5) having a generally rectangular structure constructed of a spring type material including metal and plastics providing spring compliance and having quadrilateral members (50) forming a top section with a chamber (500) receiving a heat sink and said side walls, each of said side walls formed at right angles containing an inside tab (55) which engages with said frame tab.

* * * * *